United States Patent
Lin

(10) Patent No.: US 9,300,299 B1
(45) Date of Patent: Mar. 29, 2016

(54) HIGH-SPEED INVERTER AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 14/487,119

(22) Filed: Sep. 16, 2014

(51) Int. Cl.
*H03K 3/00* (2006.01)
*H03K 19/0948* (2006.01)

(52) U.S. Cl.
CPC .................................. *H03K 19/0948* (2013.01)

(58) Field of Classification Search
None
See application file for complete search history.

(56) References Cited

U.S. PATENT DOCUMENTS

| | | | | |
|---|---|---|---|---|
| 8,604,825 | B2 * | 12/2013 | Eaton | H03K 19/00338 326/10 |
| 2007/0063728 | A1 * | 3/2007 | Briet | H03K 19/00338 326/14 |

* cited by examiner

*Primary Examiner* — Long Nguyen
(74) *Attorney, Agent, or Firm* — McClure, Qualey & Rodack, LLP

(57) ABSTRACT

A CMOS (complementary metal oxide semiconductor) inverter includes a PMOS (p-channel metal oxide semiconductor) transistor configured to receive a first input signal via a first input terminal and output a first output signal via a first output terminal, an NMOS (n-channel metal oxide semiconductor) transistor configured to receive a second input signal via a second input terminal and output a second output signal via a second output terminal, and a resistor configured to provide an isolation between the first output signal and the second output signal. In an embodiment, the first input signal is of a fast high-to-low transition but a slow low-to-high transition, and the second input signal is of a fast low-to-high transition but a slow high-to-low transition. A comparative method is also provided.

4 Claims, 3 Drawing Sheets

HIGH-SPEED INVERTER AND METHOD THEREOF

BACKGROUND OF THE INVENTION

1. Field of the Invention

The present invention generally relates to inverter circuits and more specifically to a high-speed CMOS (complementary metal oxide semiconductor) inverter circuit.

2. Description of Related

Persons of ordinary skill in the art understand terms and basic concepts related to microelectronics that are used in this disclosure, such as MOS (metal-oxide semiconductor) transistor and "source," "gate," and "drain" terminals thereof, PMOS (p-channel MOS) transistor, NMOS (n-channel MOS) transistor, and CMOS (complementary MOS). Terms and basic concepts like these are apparent from prior art documents, e.g. text books such as "Design of Analog CMOS Integrated Circuits" by Behzad Razavi, McGraw-Hill (ISBN 0-07-118839-8), and thus will not be explained in detail here.

As depicted in FIG. 1, a CMOS inverter 100 receives an input signal and outputs an output signal that is a logical inversion of the input signal. As shown in the call-out box 110, CMOS inverter 100 comprises an NMOS transistor 111 and a PMOS transistor 112. Throughout this disclosure, "$V_{DD}$" denotes a power supply circuit node. CMOS inverter 100 is well known in prior art and thus not described in detail here.

In CMOS inverter 100 of FIG. 1, the NMOS transistor 111 and the PMOS transistor 112 share a common input and also share a common output. The present invention discloses an alternative scheme that can offer a better performance.

BRIEF SUMMARY OF THIS INVENTION

An objective of the present invention is to improve a performance of a CMOS inverter by enabling a constituent PMOS transistor and a constituent NMOS transistor to function separately to allow the constituent PMOS to establish a first output of a fast low-to-high transition and the constituent NMOS to establish a second output of a fast high-to-low transition.

Another objective of the present invention is to improve a performance of a CMOS inverter chain by enabling a constituent PMOS transistor and a constituent NMOS transistor of a constituent CMOS inverter of the CMOS inverter chain to function separately to allow the constituent PMOS transistor to receive a first input signal of a fast high-to-low transition and output a first output signal of a fast low-to-high transition and to allow the constituent NMOS transistor to receive a second input signal of a fast low-to-high transition and output a second output signal of a fast high-to-low transition.

In an embodiment, a CMOS inverter comprises: a PMOS transistor configured to receive a first input signal via a first input terminal and output a first output signal via a first output terminal; an NMOS transistor configured to receive a second input signal via a second input terminal and output a second output signal via a second output terminal; and a resistor configured to provide an isolation between the first output signal and the second output signal. In an embodiment, the first input signal is of a fast high-to-low transition but a slow low-to-high transition, and the second input signal is of a fast low-to-high transition but a slow high-to-low transition.

In an embodiment, a CMOS inverter chain comprises a first CMOS inverter comprising a first PMOS transistor, a first NMOS transistor, and a first resistor, configured to receive a first signal and a second signal and output a third signal and a fourth signal, and a second CMOS inverter comprising a second PMOS transistor, a second NMOS transistor, and a second resistor, configured to receive the third signal and the fourth signal and output a fifth signal and a sixth signal, wherein: the first PMOS transistor inverts a high-to-low transition of the first signal into a low-to-high transition of the fourth signal; the first NMOS transistor inverts a low-to-high transition of the second signal into a high-to-low transition of the third signal; the first resistor provides an isolation between the third signal and the fourth signal; the second PMOS transistor inverts a high-to-low transition of the third signal into a low-to-high transition of the sixth signal; the second NMOS transistor inverts a low-to-high transition of the fourth signal into a high-to-low transition of the fifth signal; and the second resistor provides an isolation between the fifth signal and the sixth signal.

In an embodiment, a CMOS latch comprises a first CMOS inverter comprising a first PMOS transistor, a first NMOS transistor, and a first resistor, configured to receive a first signal and a second signal and output a third signal and a fourth signal, and a second CMOS inverter comprising a second PMOS transistor, a second NMOS transistor, and a second resistor, configured to receive the third signal and the fourth signal and output the first signal and the second signal, wherein: the first PMOS transistor inverts a high-to-low transition of the first signal into a low-to-high transition of the fourth signal; the first NMOS transistor inverts a low-to-high transition of the second signal into a high-to-low transition of the third signal; the first resistor provides an isolation between the third signal and the fourth signal; the second PMOS transistor inverts a high-to-low transition of the third signal into a low-to-high transition of the second signal; the second NMOS transistor inverts a low-to-high transition of the fourth signal into a high-to-low transition of the first signal; and the second resistor provides an isolation between the first signal and the second signal.

In an embodiment, a method comprises: receiving a first signal of a fast high-to-low transition but a slow low-to-high transition; receiving a second signal of a fast low-to-high transition but a slow high-to-low transition; inverting the first signal into a fourth signal using a PMOS transistor; inverting the second signal into a third signal using an NMOS transistor; and isolating the third signal and the fourth signal using a resistor.

DETAILED DESCRIPTION OF THE DRAWINGS

DETAILED DESCRIPTION OF THIS INVENTION

The present invention relates to inverter. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Figure 1:
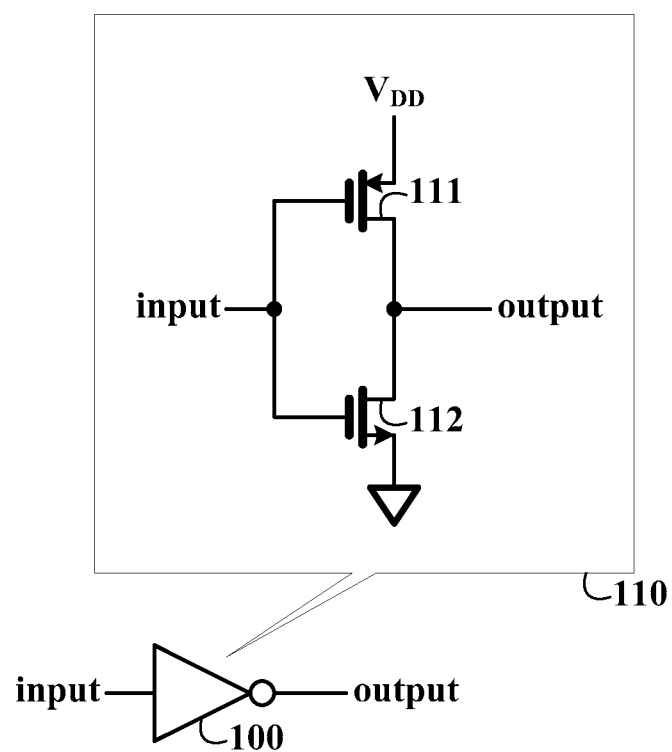
FIG. 1 shows a circuit symbol and schematic diagram of a prior art CMOS inverter.
Figure 2:
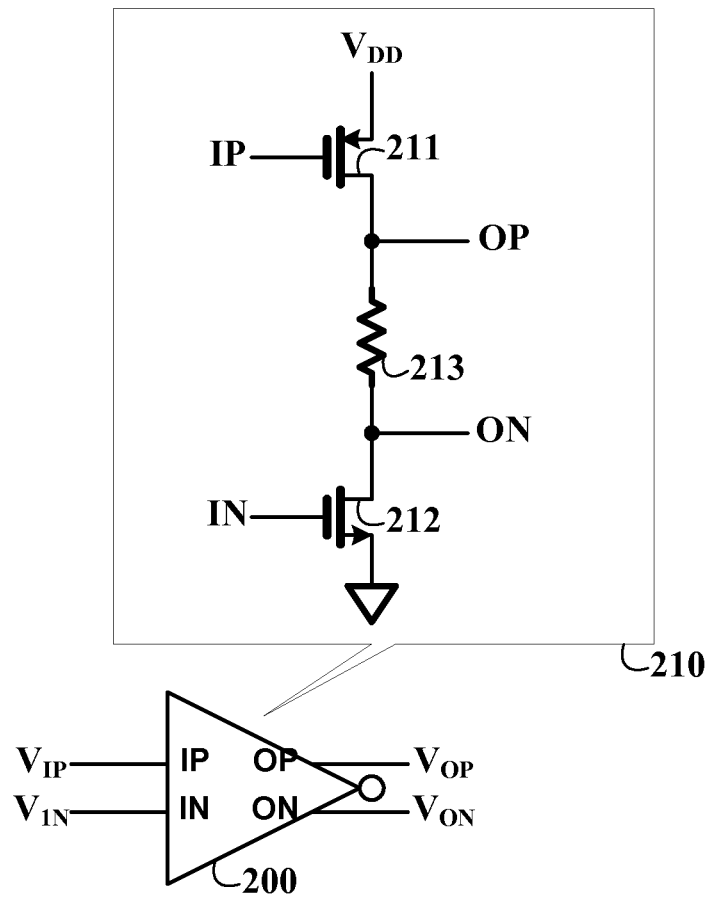
FIG. 2 shows a circuit symbol and schematic diagram of a CMOS inverter in accordance with an embodiment of the present invention.

A circuit symbol for a CMOS inverter 200 in accordance with an embodiment of the present invention is depicted in FIG. 2. As a functional block, CMOS inverter 200 comprises a first input terminal "IP" via which a first input signal $V_{IP}$ is received, a second input terminal "IN" via which a second input signal $V_{IN}$ is received, a first output terminal "OP" via which a first output signal $V_{OP}$ is output, and a second output terminal "ON" via which a second output signal $V_{ON}$ is output. A schematic diagram of CMOS inverter 200 is shown in call-out box 210. As shown, CMOS inverter 200 comprises a PMOS transistor 211, an NMOS transistor 212, and a resistor 213; the gate of PMOS transistor 211 is connected to the first input terminal "IP" and the drain of PMOS transistor 211 is connected to the first output terminal "OP"; the gate of NMOS transistor 212 is connected to the second input terminal "IN" and the drain of the NMOS transistor 212 is connected to the second output terminal "ON"; and resistor 213 is inserted between the drain of PMOS transistor 211 and the drain of the NMOS transistor 212. Since PMOS transistor 211 and NMOS transistor 212 do not share a common output, one can take advantage of the difference in transfer characteristics between PMOS transistor 211 and NMOS transistor 212 to optimize a performance of CMOS inverter 200. A PMOS transistor is more effective than an NMOS transistor in establishing a low-to-high transition of an output signal in response to a high-to-low transition of an input signal, while the NMOS transistor is more effective than the PMOS transistor in establishing a high-to-low transition of an output signal in response to a low-to-high transition of an input signal. Having this in mind, resistor 213 is inserted between the drain of PMOS transistor 211 and the drain of NMOS transistor 212 to provide an isolation between the output of PMOS transistor 211 and the output of NMOS transistor 212, so that a low-to-high transition of the first output signal $V_{OP}$ can be easily established by PMOS transistor 211 without being much impeded by NMOS transistor 212, while a high-to-low transition of the second output signal $V_{ON}$ can be easily established by NMOS transistor 212 without being much impeded by PMOS transistor 211. The first output signal $V_{OP}$ is useful for applications or occasions where a fast low-to-high transition is needed, and the second output signal $V_{ON}$ is useful for applications or occasions where a fast high-to-low transition is needed. Therefore, CMOS inverter 200 can offer improvement over the prior art CMOS inverter 100 of FIG. 1.

Figure 3:
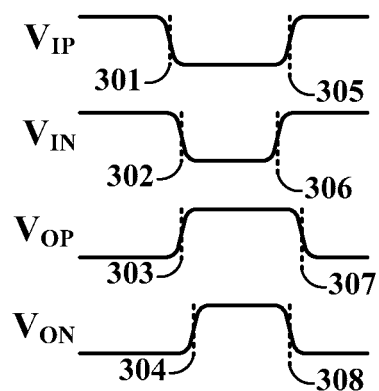
FIG. 3 shows an exemplary timing diagram of the CMOS inverter of FIG. 2.

In an embodiment, the first input signal $V_{IP}$ is the same as the second input signal $V_{IN}$ except that $V_{IN}$ has a fast low-to-high transition but slow high-to-low transition while $V_{IP}$ has a fast high-to-low transition but a slow low-to-high transition. An exemplary timing diagram for CMOS inverter 200 of FIG. 2 is shown in FIG. 3. As shown, $V_{IP}$ is similar to $V_{IN}$ except that falling edge 301 of $V_{IP}$ is slightly ahead of falling edge 302 of $V_{IN}$, while rising edge 306 of $V_{IN}$ is slightly ahead of rising edge 305 of $V_{IP}$. Since PMOS transistor 211 receives $V_{IP}$ that has a faster high-to-low transition, it enables its output $V_{OP}$ to have a faster low-to-high transition, as shown by that rising edge 303 (in response to falling edge 301) is earlier than rising edge 304 (in response to falling edge 302); since NMOS transistor 212 receives $V_{IN}$ that has an faster low-to-high transition, it enables its output $V_{ON}$ to have a faster high-to-low transition, as shown by that falling edge 308 (in response to rising edge 306) is earlier than falling edge 307 (in response to rising edge 305). PMOS transistor 211, who by nature is effective at inverting a high-to-low transition into a low-to-high transition, is further helped by receiving an input of a fast high-to-low transition; and NMOS transistor 212, who by nature is effective at inverting a low-to-high transition into a high-to-low transition, is further helped by receiving an input of a fast low-to-high transition. As a result, $V_{OP}$ can have a very fast low-to-high transition, while $V_{ON}$ can have a very fast high-to-low transition.

Figure 4:
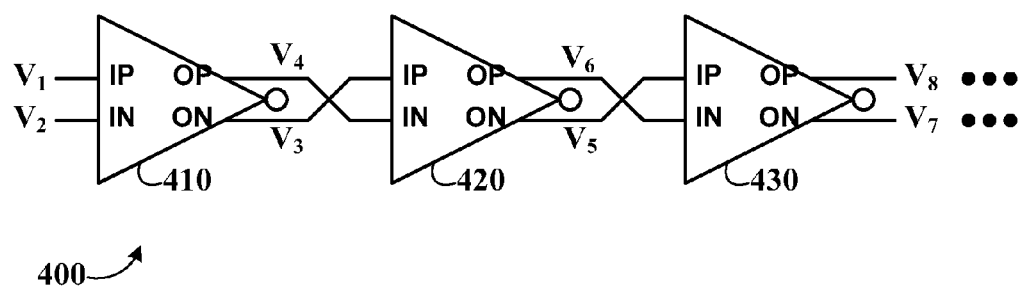
FIG. 4 shows a schematic diagram of a CMOS inverter chain in accordance with an embodiment of the present invention.

A schematic diagram of a CMOS inverter chain 400 is depicted in FIG. 4. CMOS inverter chain 400 comprises a plurality of a CMOS inverters including a first CMOS inverter 410, a second CMOS inverter 420, a third CMOS inverter 430, and so on, constructed from the same circuit of CMOS inverter 200 of FIG. 2, configured in a cascade topology, wherein an output of a CMOS inverter is an input of a subsequent CMOS inverter. The first CMOS inverter 410 receives a first signal $V_1$ and a second signal $V_2$ via its "IP" and "IN" terminals, respectively, and outputs a third signal $V_3$ and a fourth signal $V_4$ via its "ON" and "OP" terminals, respectively; the second CMOS inverter 420 receives the third signal $V_3$ and the fourth signal $V_4$ via its "IP" and "IN" terminals, respectively, and outputs a fifth signal $V_5$ and a sixth signal $V_6$ via its "ON" and "OP" terminals, respectively; the third CMOS inverter 430 receives the fifth signal $V_5$ and the sixed signal $V_6$ via its "IP" and "IN" terminals, respectively, and outputs a seventh signal $V_7$ and an eighth signal $V_8$ via its "ON" and "OP" terminals, respectively. For each CMOS inverter, two signals are received from the "IP" and "IN" terminals, and two signals are output from the "OP" and "ON" terminals. In an embodiment, the first signal $V_1$ is of a fast high-to-low transition but a slow low-to-high transition, and the second signal $V_2$ is of a fast low-to-high transition but a slow high-to-low transition. Therefore, for each CMOS inverter, the two signals received are similar but the signal received at the "IP" terminal has a fast high-to-low transition while the signal received at the "IN" terminal has a fast low-to-high transition; the two signals that are output are similar but that the signal output from the "OP" terminal has a fast low-to-high transition while the signal output from the "ON" terminal has a fast high-to-low transition. Using this arrangement, each CMOS inverter performs the logical inversion in a manner such that, the device that is more effective in establishing a low-to-high transition (i.e. PMOS transistor) receives an input with a fast high-to-low transition that further facilitates the low-to-high transition, and the device that is more effective in establishing a high-to-low transition (i.e. NMOS transistor) receives an input with a fast low-to-high transition that further facilitates the high-to-low transition.

In an embodiment, the inputs to the first CMOS inverter 410 of the CMOS inverter chain 400 (i.e. $V_1$ and $V_2$) are shorted; this arrangement is needed if the CMOS inverter chain 400 were to interface with a prior art CMOS inverter 100 (of FIG. 1) on the input side (since the prior art CMOS inverter 100 can only provide a single signal as input to the CMOS inverter chain 400). In an embodiment, the outputs of the last CMOS inverter (i.e. $V_7$ and $V_8$ if the third CMOS inverter 430 is the last CMOS inverter of the CMOS inverter chain 400) are shorted; this arrangement is needed if the CMOS inverter chain 400 were to interface with a prior art CMOS inverter 100 on the output side (since the prior art CMOS inverter 100 can only receive a single output from CMOS inverter chain 400). In this particular embodiment, the resistor inside the last CMOS inverter is not needed and can be removed.

Figure 5:
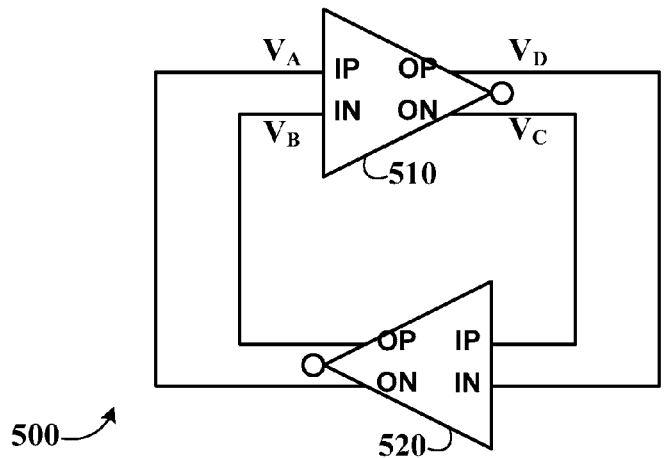
FIG. 5 shows a schematic diagram of a CMOS latch in accordance with an embodiment of the present invention.

A schematic diagram of a CMOS latch 500 is depicted in FIG. 5. CMOS latch 500 comprises two CMOS inverters, including a first CMOS inverter 510, and a second CMOS inverter 520, configured in a cross-coupling topology, wherein an output of one CMOS inverter is an input of another CMOS inverter. The first CMOS inverter 510 receives a first signal $V_A$ and a second signal $V_B$ via its "IP" and "IN" terminals, respectively, and outputs a third signal $V_C$ and a fourth signal $V_D$ via its "ON" and "OP" terminals, respectively; the second CMOS inverter 520 receives the third signal $V_C$ and the fourth signal $V_D$ via its "IP" and "IN" terminals, respectively, and outputs the first signal $V_A$ and the second signal $V_B$ via its "ON" and "OP" terminals, respectively. CMOS latch 500 allows a very fast regeneration, due to the same reason as stated earlier in describing the CMOS inverter chain 400.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit comprising:
   a first CMOS (complementary metal oxide semiconductor) inverter comprising a first PMOS (p-channel metal oxide semiconductor) transistor, a first NMOS (n-channel metal oxide semiconductor) transistor, and a first resistor, configured to receive a first signal and a second signal and output a third signal and a fourth signal, and
   a second CMOS inverter comprising a second PMOS transistor, a second NMOS transistor, and a second resistor, configured to receive the third signal and the fourth signal and output a fifth signal and a sixth signal, wherein:
   the first PMOS transistor inverts a high-to-low transition of the first signal into a low-to-high transition of the fourth signal;
   the first NMOS transistor inverts a low-to-high transition of the second signal into a high-to-low transition of the third signal;
   the first resistor provides an isolation between the third signal and the fourth signal;
   the second PMOS transistor inverts a high-to-low transition of the third signal into a low-to-high transition of the sixth signal;
   the second NMOS transistor inverts a low-to-high transition of the fourth signal into a high-to-low transition of the fifth signal; and
   the second resistor provides an isolation between the fifth signal and the sixth signal.

2. The circuit of claim 1, wherein the first signal is of a fast high-to-low transition but a slow low-to-high transition, and the second signal is of a fast low-to-high transition but a slow high-to-low transition.

3. The circuit of claim 1, wherein the first signal and the second signal are shorted.

4. A circuit comprising:
   a first CMOS (complementary metal oxide semiconductor) inverter comprising a first PMOS (p-channel metal oxide semiconductor) transistor, a first NMOS (n-channel metal oxide semiconductor) transistor, and a first resistor, configured to receive a first signal and a second signal and output a third signal and a fourth signal; and
   a second CMOS inverter comprising a second PMOS transistor, a second NMOS transistor, and a second resistor, configured to receive the third signal and the fourth signal and output the first signal and the second signal, wherein:
   the first PMOS transistor inverts a high-to-low transition of the first signal into a low-to-high transition of the fourth signal;
   the first NMOS transistor inverts a low-to-high transition of the second signal into a high-to-low transition of the third signal;
   the first resistor provides an isolation between the third signal and the fourth signal;
   the second PMOS transistor inverts a high-to-low transition of the third signal into a low-to-high transition of the second signal;
   the second NMOS transistor inverts a low-to-high transition of the fourth signal into a high-to-low transition of the first signal; and
   the second resistor provides an isolation between the first signal and the second signal.

\* \* \* \* \*